United States Patent [19]

Mori

[11] Patent Number: 4,967,099
[45] Date of Patent: Oct. 30, 1990

[54] LOW LEVEL CLAMP CIRCUIT
[75] Inventor: Hiroshi Mori, Kanagawa, Japan
[73] Assignee: Sony Corporation, Tokyo, Japan
[21] Appl. No.: 383,264
[22] Filed: Jul. 20, 1989

Related U.S. Application Data

[63] Continuation of Ser. No. 168,539, Mar. 8, 1988, abandoned, which is a continuation of Ser. No. 915,016, Oct. 3, 1986, abandoned.

[30] Foreign Application Priority Data

Oct. 7, 1985 [JP] Japan ................. 60-223100

[51] Int. Cl.$^5$ ................. H03K 5/08; H03K 4/00
[52] U.S. Cl. ................. 307/264; 307/268; 307/555; 307/565
[58] Field of Search ............. 307/540, 555, 561, 565, 307/264, 268, 296.1, 296.3

[56] References Cited

U.S. PATENT DOCUMENTS

| | | | |
|---|---|---|---|
| 3,805,095 | 4/1974 | Lee et al. ................. | 307/565 |
| 3,811,053 | 5/1974 | Habib . | |
| 3,970,777 | 7/1976 | Bradford et al. ................. | 178/7.1 |
| 4,167,682 | 9/1979 | O'Dea ................. | 307/237 |
| 4,369,466 | 1/1983 | Matsuzaki et al. ................. | 358/170 |
| 4,451,747 | 5/1984 | Rucker ................. | 307/549 |

Primary Examiner—John Zazworsky
Attorney, Agent, or Firm—Vorys, Sater, Seymour & Pease

[57] ABSTRACT

In order to stabilize an intermediate level of a clock having at three pulse output levels by a low level clamp circuit, a first negative bias driving circuit outputs a pulse with an amplitude corresponding to a first supply voltage ($E_{cc}$). The outputted pulse is clamped by a first diode and then rectified/smoothed by a second diode and a capacitor to obtain a clamp level determining a negative bias dc output ($E_{dc}$). A second intermediate level driving circuit (2) outputs a pulse with an amplitude corresponding to a voltage lower than the first supply voltage to obtain an intermediate level clock pulse to be stabilized. The low level of the intermediate level clock is further clamped to the obtained negative bias dc output by a third diode. The intermediate level is stabilized against supply voltage and/or temperature fluctuations, without use of any Zener diode.

10 Claims, 2 Drawing Sheets

LOW LEVEL CLAMP CIRCUIT

This application is a continuation of application Ser. No. 168,539, filed Mar. 8, 1988, now abandoned, which is a continuation of Ser. No. 715,016, filed Oct. 3, 1986, now abandoned.

BACKGROUND OF THE INVENTION

1. Field of the Invention

The present invention relates to a low level clamp circuit for clamping a low level of a multilevel clock signal having, for example, at least three levels. More specifically, this invention relates to a low level clamp circuit suitably used for clamping a low level of a multi-level clock signal in which an intermediate level, in particular, is required to be stabilized, for instance when the multilevel clock signal is used as an image element driving clock for a charge-coupled device (CCD).

2. Description of the Prior Art

As a driving clock for a vertical register for solid image elements such as a so-called CCD imager, a three-level clock signal as shown in FIG. 1 is used. Where a clamping operation is used to stabilize the levels of this three-level clock signal, a low-level clamping operation is preferable to maintain the stability of the clamping operation, since the clamping period is short. In general, when an electric charge of the CCD image elements is transferred, the second (intermediate) level of a multi-level driving clock is very important. Therefore, it has been especially desirable to improve the accuracy of the second level of the driving clock signal.

When a three-level clock signal as shown in FIG. 1 is clamped at its lowest level and then supplied to the CCD image element, there exist drawbacks in that the amplitude in the driving clock signal changes between the low level and the second (intermediate) level due to power supply voltage fluctuations or element characteristic fluctuations based upon temperature change. Thus, the clamped second level fluctuates while transferring the electric charge relative to the stable low level. An example of a prior art low level clamp circuit will be described as to circuit configuration and operation under the section captioned.

DETAILED DESCRIPTION OF THE PREFERRED EMBODIMENTS

It has remained a problem in the art, however, to clamp a clocked biasing signal at a first level and accurately clamp a second (i.e., intermediate) level biasing signal at a value accurately related to the first level.

SUMMARY OF THE INVENTION

With these problems in mind, therefore, it is the primary object of the present invention to provide a low-level clamp circuit which can stably maintain the intermediate level of a multi-level clamping circuit, even if the power supply voltage fluctuates or the temperature characteristics of circuit elements (e.g., diodes) fluctuate. Stated otherwise, the invention provides a low level clamp circuit in which the intermediate level, i.e., the second level, of the multilevel clock signal having at least three levels is stabilized. Further, in the circuit of the present invention, since no Zener diode is incorporated, it is possible to avert the harmful influence due to the difference in diode operation characteristics and/or the fluctuations in diode temperature characteristics of a Zener diode.

To achieve the above-mentioned general object, a low level clamp circuit according to the present invention comprises: (a) a first driving circuit for receiving a supply voltage Ecc and outputting a pulse with an amplitude corresponding to the received supply voltage Ecc, in response to a first clock pulse; (b) a first diode with a first forward voltage drop; (c) a second (intermediate level) driving circuit for receiving a supply voltage, which is the same as supply voltage as for the first driving circuit but is supplied via the first diode, and outputting a clock pulse with an amplitude corresponding to the received supply voltage, and at an intermediate potential level within the waveform of the clock pulse signal to be output, wherein this intermediate level to be stabilized, as it is produced in response to the first clock pulse; (d) a second diode responsive to the first driving circuit for clamping a high level of a pulse corresponding to the pulse outputted from the first driving circuit thus providing a clamped pulse; (e) a rectifying/smoothing circuit including a third diode and a capacitor, responsive to the high level clamped pulse outputted via the second diode, for outputting a negative bias dc output; and (f) a fourth diode connected between the output of the second driving circuit and the rectifying/smoothing circuit, for clamping the low level of the clock pulse outputted from the second (intermediate level) driving circuit to the rectified/smoothed negative bias dc output.

Furthermore, a third (high level) driving circuit is incorporated to receive a third positive bias supply voltage and output a pulse to be superposed upon the supply voltage as supplied to the second (intermediate level) driving circuit in response to a second clock pulse.

The supply voltage applied to the first driving circuit is equal to the sum of the supply voltage as applied to the second intermediate level driving circuit and the first forward voltage drop of the first diode.

In addition, the first to fourth diodes are determined so that a formula $VF_1 + VF_4 = VF_2 + VF_3$ can be satisfied, where $VF_n$ respectively denotes each forward voltage drop of each diode. The diodes are preferably Schottky diodes.

These and other features of the invention will become apparent from the detailed description of the invention which follows, taken in conjunction with the accompanying drawings.

BRIEF DESCRIPTION OF THE DRAWINGS

The features and advantages of the low level clamp circuit according to the present invention will be more clearly appreciated from the following description of the preferred embodiment of the invention taken in conjunction with the accompanying drawings in which.

DETAILED DESCRIPTION OF THE PREFERRED EMBODIMENT

To facilitate an understanding of the present invention, a brief reference will be made to an example of a prior art low level clamp circuit for a three-level clock with reference to the attached drawings.

Figure 1:
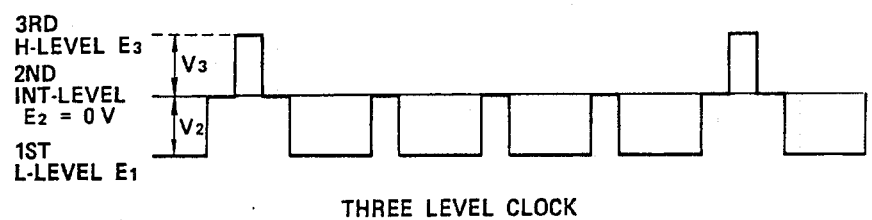
FIG. 1 is a waveform diagram showing an example of three-level clock pulses.

In FIG. 1, a three-level clock signal is shown, having a first (low) level $E_1$, a second (intermediate) level $E_2$, and a third (high) level $E_3$. The pulse amplitude (absolute magnitude) between the first (low) level $E_1$ and the second (intermediate) level $E_2$ is $V_2$, while that between the second (intermediate) level the third (high) level $E_3$ is $V_3$. The voltage potential of the second (intermediate) level $E_2$ is 0V. Such a multi-level clock signal is useful as a driving clock for a vertical register for solid image elements, such as in a so-called CCD imager. The respective levels of the clock signal shown in FIG. 1 are preferably clamped, such as by a prior art circuit shown in FIG. 2 for stability.

Figure 2:
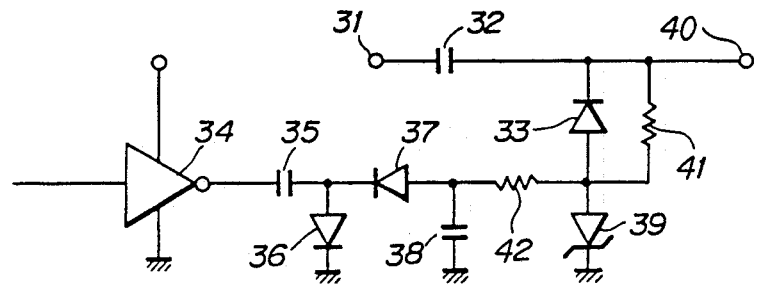
FIG. 2 is a schematic circuit diagram of a prior art low level clamp circuit.

In FIG. 2, a three-level clock pulse signal of any given (dc) level as shown in FIG. 1 is supplied as an input pulse signal to an input terminal 31. The dc component of the input pulse signal is blocked by a dc blocking capacitor 32 and is clamped at a low level by a clamping diode 33. In this clamping operation, the negative bias dc voltage for determining the clamp level is obtained as follows. An output pulse having an amplitude sufficiently larger than the pulse amplitude between the first (low) level and the second (intermediate) level of the three-level clock is outputted from a driving circuit 34 and shifted to the negative side via a capacitor 35 and a diode 36. The output pulse is rectified and smoothed via a diode 37 and a capacitor 38 to obtain a sufficiently low bias dc (the first driving circuit 34 could thus be referred to as a "negative bias" driving circuit, because of the negative dc bias ultimately provided for determining the low value of the multi-level clock signal which is to be outputted). The output pulse at an output terminal 40 is stabilized by a Zener diode 39 having a Zener voltage corresponding to the low pulse level. A resistor 41 is in parallel with the clamping diode 33, while a resistor 42 receives the rectified and smoothed output pulse.

In the circuit configuration as described above, however, the low level of the three-level clock is thus determined by the Zener voltage of the Zener diode 39. When the amplitude of the three-level clock changes due to power supply voltage fluctuations, the second (intermediate) level also undesirably fluctuates accordingly. In addition, there exist other problems whereby the clamp level fluctuates due to a change of the temperature characteristics of the low-level clamping diode 33 and to a difference in the operating characteristics of the Zener diode 39, and the fluctuations of the temperature characteristics of the Zener voltage of the Zener diode 39.

Figure 3:
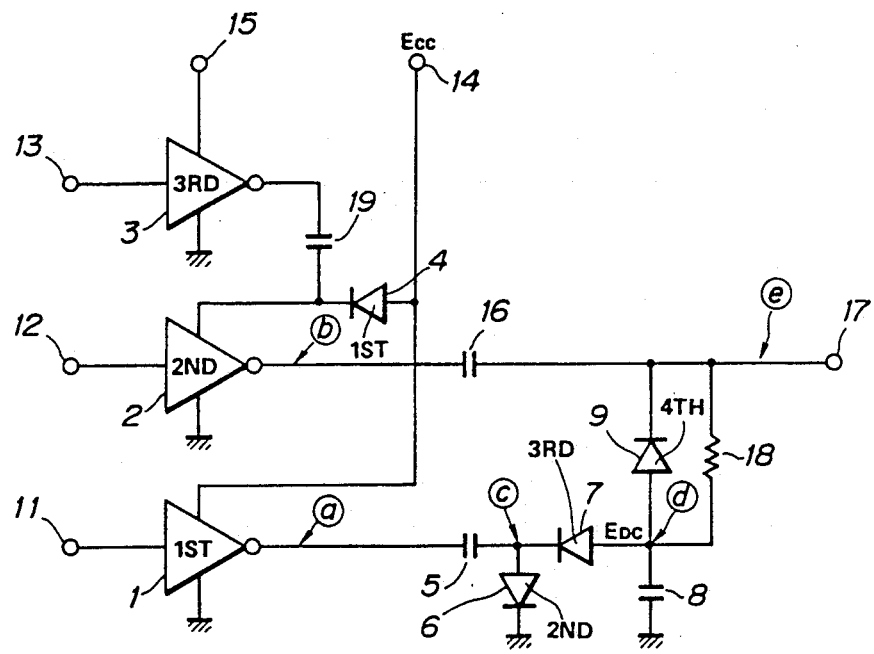
FIG. 3 is a schematic circuit diagram of an embodiment of the low level clamp circuit according to the present invention.

Reference is now made to an embodiment of a low-level clamp circuit according to the present invention. The low-level clamp circuit shown in FIG. 3 is an exemplary circuit for producing a three-level clock signal used as a transferring and driving clock signal in a CCD image element in a vertical register, as explained together with FIG. 1 in which accuracy is required for the second (intermediate) level. In the following description, the first (low) level signal of the three level clock pulse shown in FIG. 1 is denoted as E1 ($E_1 < 0$ volts); the second (intermediate) level signal thereof is denoted as E2; the third (high) level signal thereof is denoted as E3 ($E_3 > 0$ V); the voltage amplitude between the first (low) level signal and the second (intermediate) level signal is denoted as $V_2$, which is equal to $E_2 - E_1$ ($V_2 > 0$ V); the voltage amplitude between the second (intermediate) level signal and the third (high) level signal is denoted as $V_3$, equal to $E_3 - E_2$ ($E_3 > 0$ V); and the second intermediate level E2 is to be stabilized accurately relative to ground potential at zero volts ($E_2 = 0$ V).

In FIG. 3, a clock pulse corresponding to a waveform between the first (low) level $E_1$ and the second (intermediate) level $E_2$ of the above three-level clock is supplied to an input terminal 11 of a first driving circuit 1 (in other words, a "negative bias" driving circuit for allowing the providing of a negative bias voltage to serve as the clamping reference voltage for the multi-level clock signal), and this clock pulse is also supplied to an input terminal 12 of a second level driving circuit 2. Further, a pulse corresponding to the waveform of the third (high) level is supplied to an input terminal 13 of a third-level driving circuit 3. A bias volt Ecc is supplied to a voltage supply terminal 14 of the driving circuit 1 in order to obtain an output at circuit point a having an amplitude $V_2$ between the low level $E_1$ and the second or intermediate level $E_2$. The actual output of the circuit 1 is higher than $V_2$ by the magnitude of a forward voltage drop $VF_1$ of the first diode 4 as described later. Since the negative side voltage supply terminal of the driving circuit 1 is grounded, the potential Vcc of the output pulse is equal to the above voltage Ecc. The supply voltage Ecc is also supplied to the second (intermediate level) driving circuit 2 from the voltage supply terminal 14 through a first diode 4. The above voltage Ecc' which is equal in magnitude to $V_2 + VF_1$, is so determined, that the output amplitude of the driving circuit 2 may be equal to the amplitude $V_2$ between the first (low) level and the second (intermediate) level as shown in FIG. 1. Further, a supply voltage for the third (high) level of the clock signal is supplied to a voltage supply terminal 15 of the third (high-level) driving circuit 3 to obtain an output having a voltage amplitude $V_3$ between the second (intermediate) level $E_2$ and the thirdhigh level $E_3$.

One terminal of a capacitor 5 is connected to circuit point a of the first (negative bias, that is, low level) driving circuit 1. An anode of a second diode 6 is connected to the other terminal of the capacitor 5, and a cathode of the second diode 6 is grounded. The second diode 6 is responsive to the first driving circuit 1, for clamping a high level of the pulse output to circuit point a from the circuit 1 and for outputting a clamped pulse at junction point c between the capacitor 5 and the diode 6. A cathode of a third diode 7 for rectification is connected to the junction point c An anode of the third diode 7 is grounded through a smoothing capacitor 8. At the junction point d between the third diode 7 and the capacitor 8, a negative bias dc level $E_{DC}$ is produced, for determining the low-level of the clamped signal and the junction point d is also connected to an anode of a fourth clamping diode 9. A terminal of a capacitor 16 is connected to an output of the second (intermediate-level) driving circuit 2 at circuit point b, and the other terminal of the capacitor 16 is connected to a cathode of the clamping diode 9 and an output terminal 17. A resistor 18 is connected in parallel with the clamping diode 9. It is preferable to select each diode 4, 6, 7 and 9 so as to satisfy the formula $VF_1 +$ $VF_4 = VF_2 + VF_3$, wherein $VF_1$, $VF_2$, $VF_3$, or $VF_4$ denotes each of the forward voltage drops of the first to fourth diodes 4, 6, 7 and 9.

The output pulse from the third (high level) driving circuit 3 is supplied to a voltage supply terminal of the second driving circuit 2 through a capacitor 19, for instance, so as to be superposed upon the supply applied to the second driving circuit 2.

Figure 4:
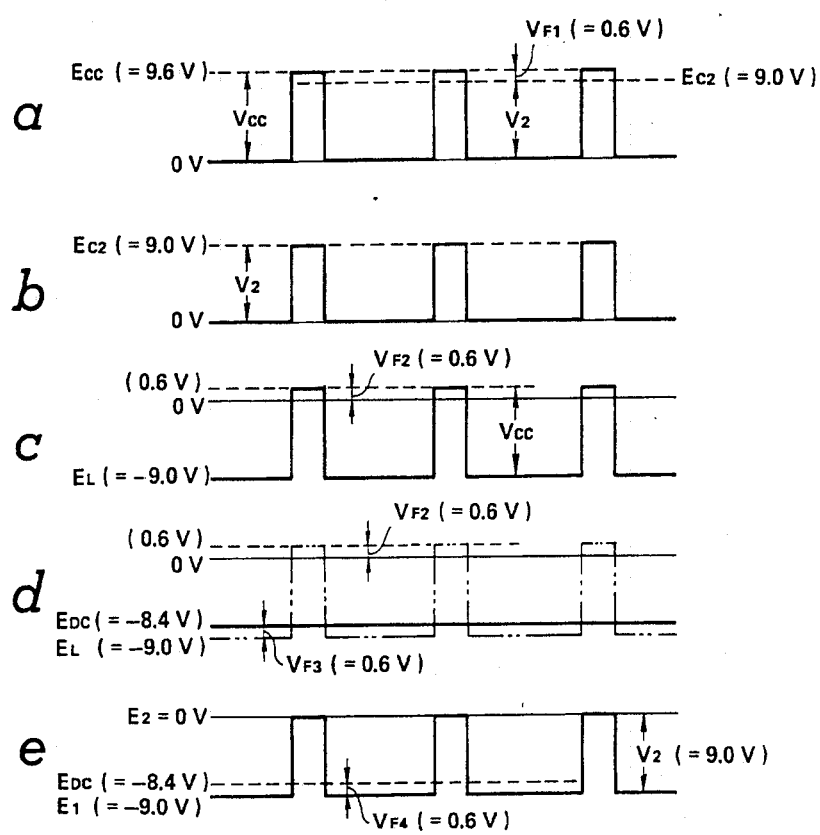
FIG. 4 is a waveform diagram for assistance in explaining the operation of the circuit shown in Fig. 3, in which the circled symbols a to e designate each respective point in the circuit shown in FIG. 3.

In the low level clamp circuit configured as described above, when the output characteristics of the first (negative bias) driving circuit 1 and the second (intermediate level) driving circuit 2 are determined to be equal to each other, a difference between the two supply voltages, that is, a voltage difference corresponding to the forward voltage drop $VF_1$ of the first diode 4 appears between the two output pulse amplitudes of the driving circuits 1 and 2. For the case of unity gain, as between the supply voltage as provided to each driving circuit and the respective amplitude of the output pulse from the respective driving circuit, then the output pulse of the first driving circuit 1 has a voltage amplitude $V_{cc}$ that is equal to the absolute value of the difference between ground potential (0 volts) and the supply voltage level $E_{cc}$, as shown in FIG. 4a, and the output pulse of the second driving circuit 2 has a voltage amplitude $V_2$ which is somewhat less than the absolute value $V_{cc}$. For instance, in the case of linearity between the supply voltage and the amplitude of the output pulse from the driving circuit, if the amplitude of the voltage $V_2$ is 9.0V and the forward voltage drop $VF_1$ of the first diode 4 is 0.6V, the supply voltage level $E_{c2}$ supplied to the second driving circuit 2 becomes 9.0V, i.e., 9.6 − 0.6, by setting the supply voltage $E_{cc}$ to 9.6V. Therefore, the potential difference between $E_{c2}$ and ground is 9.0V. Therefore, it is possible to obtain an output pulse at circuit point b with a determined amplitude $V_2$, equal to 9.0V, from the driving circuit 2, as shown in FIG. 4b.

Further, the output pulse with an amplitude Vcc from the first driving circuit 1 is fixed so that the high level of that output pulse becomes equal to the forward voltage drop $VF_2$ of the second diode 6, by that amount higher than the ground level, because of the clamping action of the capacitor 5 and the second diode 6. Therefore, a pulse output shifted to the negative side can be obtained as shown in FIG. 4c. The low level $E_L$ of this pulse, as shown in FIG. 4c is $0 + VF_2 − V_{cc}$: therefore, if $VF_2 = 0.6V$, then $E_L = −9.0V$.

The output pulse shown in FIG. 4c is rectified and smoothed by the third diode 7 and the capacitor 8, so that a negative bias dc voltage $E_{DC}$ for determining the clamp level can be obtained as shown in FIG. 4d. Because of the forward voltage drop $VF_3$ of the third diode 7, the obtained negative bias dc level $E_{DC}$ is raised by $VF_3$ to a value $E_{DC}$ equal to $E_L + VF_3$ from the low level of $E_L$ for the pulse shown in FIG. 4c. Therefore, if $VF_3 = 0.6V$, then $E_{DC} = −8.4V$, as shown in FIG. 4d.

Although the output pulse with an amplitude $V_2$ (as shown in FIG. 4b) of the second driving circuit 2 has its low-level clamped by the fourth clamping diode 9 with the negative bias dc level $E_{DC}$ as the clamping basis, since the low level $E_1$ of this clamped pulse (see FIG. 4e) becomes a level $E_1$ equal to $E_{DC} − VF_4$. As a result of this forward voltage drop $VF_4$ of the diode 9, the low level $E_1$ of this clamped pulse at circuit point e is lower than the negative bias dc level $E_{DC}$. If $VF_4 = 0.6V$, then $E_1 = −9.0V$. Therefore, since the pulse amplitude $V_2$ shown in FIGS. 4b and 4e is 9.0V, the second (i.e., intermediate) level $E_2$ of the pulse (as shown in FIG. 4e) is set (i.e., clamped) to the desired 0 V.

The amplitude $V_2$ of the pulse shown in FIG. 4e is given by subtracting the forward voltage drop $VF_1$ of the first diode 4 from the potential difference $V_{cc}$ between the negative bias supply voltage level $E_{cc}$ and the ground level ($V_2 = V_{cc} − VF_1$). In contrast with this, the low level $E_1$ of the pulse shown in FIG. 4e is equal to $E_{DC} − VF_4$. This low level $E_1$ is lower than the negative bias dc level $E_{DC}$ by the forward voltage drop $V_{F4}$ of the diode 9. The second (intermediate) level $E_2$ can thus be expressed as $E_2 = E_1 + V_2 = E_{DC} − VF_4 + V_{cc} − VF_1$ Further, as explained with respect to FIG. 4d, the negative bias dc level $E_{DC}$ can be obtained as $E_L + VF_3$, and $E_L$ can be given as $0 + VF_2 − V_{cc}$ as shown in FIG. 4c. Thus, this negative bias dc level can be written as:

$E_{DC} = E_L + VF_3 = 0 + VF_2 − V_{cc} + VF_3$

Therefore, finally $E_2$ can be expressed as $$\begin{aligned} E_2 &= E_{DC} - VF_4 + V_{cc} - VF_1 \\ &= 0 + VF_2 - V_{cc} + VF_3 - VF_4 + V_{cc} - VF_1 \\ &= VF_2 + VF_3 - (VF_1 + VF_4) \end{aligned}$$

Therefore, by previously providing that the sum $VF_2 + VF_3$ and $VF_1$ and the sum $VF_4$ are equal to each other, it is always possible with the circuit of FIG. 3 to accurately stabilize $E_2$ to 0 volts, i.e., ground level, irrespective in the fluctuations of supply voltage $E_{cc}$. It is readily possible to provide the temperature characteristics of each of the diodes 4, 6, 7 and 9 equal to those of the others of these diodes in such a way that the temperature characteristic fluctuations of two of these diodes cancel those of the other two diodes, to satisfy the last equation above. Thus, it is possible to stably maintain the second (intermediate) level against the fluctuations in each diode due to temperature change.

On the other hand, because the current flowing through the fourth clamping diode 9 is generally very small and the forward voltage drop $VF_4$ is naturally slightly lowered as compared with the other diodes $VF_1$ to $VF_3$, it is preferable to configure the circuit so that the formula $VF_1 + VF_4 = VF_2 + VF_3$ can be established by using Schottky diodes each having a small forward voltage drop, for instance, as for the second and third diodes 6 and 7.

The difference between the amplitude $V_2$ of the output pulse of the second (intermediate level) driving circuit 2 and the amplitude $V_{cc}$ of the output pulse of the first driving circuit 1 is equal to the forward voltage drop $VF_1$ of the first diode. The negative bias dc level $E_{DC}$ at circuit point d obtained by high-level clamping and rectifying/smoothing the output pulse from the first driving circuit 1 corresponds to a value obtained by subtracting two forward voltage drops $VF_2$ and $VF_3$ of the second and third diodes from the amplitude $V_{cc}$ of the output pulse of the first driving circuit 1. The low level $E_L$ (see FIG. 4d), obtained when the output pulse of the driving circuit for the intermediate level is low-level clamped with the negative bias dc level as a clamp level, corresponds to a level obtained by subtracting the forward voltage drop $VF_4$ of the fourth diode from the negative bias dc level $E_{DC}$. Therefore, the intermediate level of the low-level clamped output pulse can be determined according to the value $VF_2 + VF_3 − (VF_1 +$ VF4) expressed by each of the forward voltage drops VF1 to VF4 of the first to fourth diodes. By low-level clamping of a multi-level clock pulse such as a three-level clock pulse, it is possible to readily maintain the intermediate level accurately and stably against fluctuations in supply voltage and due to temperature, by selecting the first to fourth diodes so that the value $VF_2 + VF_3 - (VF_1 + VF_4)$ can always be kept at a constant level including the temperature characteristics thereof. Furthermore, since no Zener diode such as a Zener diode 39 as in the prior art is used, there is no level variation due to a particular of Zener diode and/or fluctuations due to change in its characteristics due to temperature.

The invention may be embodied in other specific forms without departing from its spirit or essential characteristics. The present embodiments are, therefore, to be considered in all respects as illustrative and not restrictive, the scope of the invention being indicated by the claims rather than by the foregoing description. All modifications and variations of the present invention which come within the meaning and range of the equivalents of the claims are therefore intended to be embraced therein.

What is claimed is:

1. A circuit for outputting a three-level clock pulse signal, comprising:
    a first driving circuit for receiving at a first respective input a first supply voltage and at a respective second input a first clock pulse signal, and for outputting a first voltage pulse at an output with an amplitude corresponding to said first supply voltage, in response to said first clock pulse;
    a first diode having first and second terminals, and receiving at said first terminal said first supply voltage, said first diode having a respective forward voltage drop when in a conducting state;
    a second driving circuit having a respective first input connected to said second terminal of said first diode for receiving a second supply voltage via said first diode that is less than said first supply voltage input to said first driving circuit, as a result of said forward voltage drop of said first diode, and for outputting, in response to said first clock pulse which is also provided at a respective second input of said second driving circuit, a second voltage pulse with a respectively smaller amplitude corresponding to said smaller supply voltage;
    a second diode operatively connected to said output of said first driving circuit, for clamping a high level of each said first pulse outputted from said first driving circuit and for outputting at a respective output a corresponding clamped pulse for each said first pulse, said second diode having a respective forward voltage drop when in a conducting state;
    a rectifying/smoothing circuit including a third diode and a first capacitor connected in series, with the cathode of said third diode connected to the anode of said second diode, said rectifying smoothing circuit being responsive to said clamped pulses outputted from said second diode for outputting at the anode of said third diode a negative dc bias voltage, said third diode having a respective forward voltage drop when in a conducting state; and
    a second capacitor and a fourth diode connected between said output of said second driving circuit and said rectifying/smoothing circuit for clamping the low level of each said second pulse outputted from said second driving circuit with said negative dc bias voltage, said fourth diode having a respective forward voltage drop when in a conducting state.

2. The circuit set forth in claim 1, which further comprises:
    a third driving circuit for receiving at a respective first input a third supply voltage and a second clock signal at a respective second input, and for outputting at a respective output a pulse which is superimposed upon said second supply voltage applied to said second driving circuit in response to said second clock pulse.

3. The circuit as set forth in claim 1, wherein said supply voltage ($E_{cc}$) applied to said first input of said first driving circuit is equal to the sum of said bias voltage applied to said first input of said second driving circuit and said forward voltage drop of said first diode.

4. The circuit as set forth in claim 1, wherein the sum of said forward voltage drops of said first and fourth diodes equals the sum of said forward voltage drops of said second and third diodes.

5. The circuit as set forth in claim 1, wherein said first, second, third and fourth diodes are Schottky diodes.

6. A circuit for providing a clock pulse signal of at least three levels, said circuit comprising:
    a dc supply voltage;
    bias driver circuit means in series with a source of first clock signals, said bias driver circuit means including
    a first driving circuit for receiving said dc supply voltage at a first input, and for outputting at a first output a first output clock pulse corresponding in amplitude to said dc supply voltage, in response to said first clock pulse provided at a second input of said first driving circuit, and
    a second driving circuit having a respective first input connected to a first diode with a forward voltage drop when in a conducting state, said first diode being connected in series between said dc supply voltage and said first input of said second driving circuit, said second driving circuit having an output for outputting, in response to said first clock pulse, a respective second output clock pulse with amplitude corresponding to the difference in voltage between said dc supply voltage and said forward voltage drop of aid first diode;
    a clamping and smoothing circuit means for clamping a high level of said first output clock pulse outputted from said first driving circuit, said clamping and smoothing circuit including a second diode which has its anode operatively connected to said output of said first driving circuit, for clamping a high level of said first output clock pulse outputted from said first driving circuit, and a third diode having its cathode connected to said anode of said second diode for outputting from its anode a negative dc clamping voltage; and
    fourth diode means operatively connected between said output of said second driving circuit and said clamping and smoothing means, for clamping a low level of said second output clock pulse outputted from said second intermediate level driving circuit with said negative dc clamping voltage of said clamping and smoothing means.

7. The circuit as set forth in claim 6, further including a third driving circuit having a respective first input for receiving a positive dc supply voltage and an output for outputting a pulse which is superimposed upon said dc supply voltage applied to said first input of said second driving circuit, in response to a second clock pulse supplied at a second input of said third driving input.

8. The circuit as set forth in claim 6, wherein said dc supply voltage applied to said first input of said first driving circuit is equal to the sum of the voltage applied to said first input of said second driving circuit from said dc supply voltage via said first diode and said forward voltage drop of said first diode.

9. The circuit as set forth in claim 6, wherein said first, second, third and fourth diodes are such that the sum of the forward voltage drops of said first and fourth diodes is equal to the sum of the forward voltage drops of said second and third diodes.

10. The circuit as set forth in claim 6 wherein said first, second, third and fourth diodes are Schottky diodes.

* * * * *